United States Patent
Hsiao et al.

(10) Patent No.: US 10,628,257 B2
(45) Date of Patent: Apr. 21, 2020

(54) MEMORY MANAGEMENT METHOD AND STORAGE CONTROLLER

(71) Applicant: Shenzhen EpoStar Electronics Limited CO., Shenzhen (CN)

(72) Inventors: Yu-Hua Hsiao, Hsinchu County (TW); Chia-Wei Chang, Kaohsiung (TW)

(73) Assignee: Shenzhen EpoStar Electronics Limited CO., Shenzhen (CN)

( * ) Notice: Subject to any disclaimer, the term of this patent is extended or adjusted under 35 U.S.C. 154(b) by 147 days.

(21) Appl. No.: 16/026,079

(22) Filed: Jul. 3, 2018

(65) Prior Publication Data

US 2019/0303239 A1 Oct. 3, 2019

(30) Foreign Application Priority Data

Apr. 2, 2018 (TW) .............. 107111550 A (51) Int. Cl.
  *G06F 11/10* (2006.01)
  *G11C 29/52* (2006.01)
  (Continued)

(52) U.S. Cl.
  CPC ........ *G06F 11/1068* (2013.01); *G06F 3/0616* (2013.01); *G06F 3/0619* (2013.01); *G06F 3/0647* (2013.01); *G06F 3/0679* (2013.01); *G06F 12/0253* (2013.01); *G11C 29/52* (2013.01); *G06F 2212/1036* (2013.01);
  (Continued)

(58) Field of Classification Search
  CPC ............... G06F 11/1068; G06F 3/0647; G06F 12/0253; G06F 3/0679; G06F 3/0616; G06F 3/0619; G06F 2212/7205; G06F 2212/1036; G06F 2212/7211; G06F 11/1072; G11C 29/52; G11C 2029/0409
  See application file for complete search history.

(56) References Cited

U.S. PATENT DOCUMENTS 8,159,881 B2  4/2012 Yang
8,498,152 B2  7/2013 Alrod et al.
(Continued)

FOREIGN PATENT DOCUMENTS

CN  104616695  12/2017
CN  107527644  12/2017
(Continued)

OTHER PUBLICATIONS

"Office Action of Taiwan Counterpart Application", dated Nov. 8, 2018, p. 1-p. 3.

*Primary Examiner* — Shelly A Chase
*Assistant Examiner* — Muhammad A Siddiqui
(74) *Attorney, Agent, or Firm* — JCIPRNET (57) ABSTRACT

A memory management method for a storage device having a rewritable non-volatile memory module is provided, wherein the rewritable non-volatile memory module has a plurality of physical units, and each of the physical units has a plurality of word-lines. The method includes: performing a first checking operation on a target physical unit among the physical units according to an occurrence of a specific event; and determining whether a first operation needs to be performed on valid data in the target physical unit according to a checking result of the first checking operation that corresponds to the target physical unit.

20 Claims, 4 Drawing Sheets

(51) Int. Cl.
*G06F 3/06* (2006.01)
*G06F 12/02* (2006.01)

(52) U.S. Cl.
CPC .............. *G06F 2212/7205* (2013.01); *G06F 2212/7211* (2013.01)

(56) References Cited

U.S. PATENT DOCUMENTS

| | | | |
|---|---|---|---|
| 9,025,393 B2 | 5/2015 | Wu | |
| 2013/0003459 A1 | 1/2013 | Ulriksson et al. | |
| 2015/0262677 A1* | 9/2015 | Lin .......................... | G11C 7/02 365/185.12 |
| 2015/0309856 A1* | 10/2015 | Weilemann, II .... | G06F 11/0772 714/47.3 |
| 2017/0206979 A1* | 7/2017 | Cohen ................. | G11C 16/3495 |

FOREIGN PATENT DOCUMENTS

| | | |
|---|---|---|
| TW | 201501124 | 1/2015 |
| TW | I608350 | 12/2017 |

\* cited by examiner

MEMORY MANAGEMENT METHOD AND STORAGE CONTROLLER

CROSS-REFERENCE TO RELATED APPLICATION

This application claims the priority benefit of Taiwan application serial no. 107111550, filed on Apr. 2, 2018. The entirety of the above-mentioned patent application is hereby incorporated by reference herein and made a part of this specification.

BACKGROUND

Technical Field

The disclosure relates to a memory management method, particularly to a memory management method and a storage controller for a storage device having a rewritable non-volatile memory module.

Related Art

Generally, a controller of a storage device having a rewritable non-volatile memory module uses a specific memory management operation (e.g., wear leveling operation) to reduce a difference between respective program erase cycle counts of a plurality of physical units of the rewritable non-volatile memory module, so that the physical units of the rewritable non-volatile memory module can age uniformly.

In a conventional method, a timing for initiating a wear leveling operation is determined as follows. Whether a physical unit among the physical units has a program erase cycle count exceeding another threshold value is identified, and the wear leveling operation is performed on the physical unit exceeding the another threshold value.

However, in some cases, a greater program erase cycle count of a physical unit does not indicate a higher degree of aging of the physical unit. That is, the physical unit does not necessarily require that the wear leveling operation be performed thereon. That is, the conventional method of determining whether to initiate the memory management operation such as the wear leveling operation according to the program erase cycle count may not be able to truly manage an aged physical unit. In other words, the conventional method may overlook physical units which are aged but have a small program erase cycle count, and use space/service life of the rewritable non-volatile memory module is thus reduced.

Based on the above, how to use another method for determining whether to perform the wear leveling operation or other similar memory management operation to improve defects of the conventional method so as to extend the overall service life of the rewritable non-volatile memory module is a subject worth study for persons skilled in the art.

SUMMARY

The disclosure provides a memory management method and a storage controller, by which it is possible to determine, without using a program erase cycle count, a specific physical unit on which a memory management operation should be performed.

An embodiment of the disclosure provides a memory management method adapted for a storage device having a rewritable non-volatile memory module, wherein the rewritable non-volatile memory module has a plurality of physical units, and each of the physical units has a plurality of word-lines. The memory management method includes the following steps. A first checking operation is performed on a target physical unit among the physical units according to an occurrence of a specific event. Whether a first operation needs to be performed on valid data in the target physical unit is determined according to a checking result corresponding to the target physical unit. The performed first checking operation includes the following steps. A first target word-line among a plurality of target word-lines of the target physical unit is identified. A first optimization read voltage set and a first preset read voltage set of the first target word-line are identified. A first predetermined threshold value is identified, wherein the first predetermined threshold value is obtained according to an error checking and correction capability of the storage device. Whether a first voltage offset value between the first optimization read voltage set and the first preset read voltage set is greater than the first predetermined threshold value is determined, wherein, if the first voltage offset value is greater than the first predetermined threshold value, it is determined that the checking result corresponding to the target physical unit is failure, and if the first voltage offset value is not greater than the first predetermined threshold value, it is determined that the checking result corresponding to the target physical unit is success.

An embodiment of the disclosure provides a storage controller configured to control a storage device having a rewritable non-volatile memory module. The storage controller includes a connection interface circuit, a memory interface control circuit, a read voltage management circuit unit and a processor. The connection interface circuit is configured to be coupled to a host system. The memory interface control circuit is configured to be coupled to the rewritable non-volatile memory module, wherein the rewritable non-volatile memory module has a plurality of word-lines. The processor is coupled to the connection interface circuit, the memory interface control circuit and the read voltage management circuit unit. The processor is configured to perform a first checking operation on a target physical unit among a plurality of physical units according to an occurrence of a specific event, wherein in the performed first checking operation, according to the specific event, the processor identifies a first target word-line among a plurality of target word-lines of the target physical unit; the processor identifies a first optimization read voltage set and a first preset read voltage set of the first target word-line through the read voltage management circuit unit; the processor identifies a first predetermined threshold value, wherein the first predetermined threshold value is obtained according to an error checking and correction capability of the storage device; and the processor determines whether a first voltage offset value between the first optimization read voltage set and the first preset read voltage set is greater than the first predetermined threshold value, wherein, if the first voltage offset value is greater than the first predetermined threshold value, the processor determines that a checking result corresponding to the target physical unit is failure, and if the first voltage offset value is not greater than the first predetermined threshold value, the processor determines that the checking result corresponding to the target physical unit is success. The processor is further configured to determine whether a first operation needs to be performed on valid data in the target physical unit according to the checking result corresponding to the target physical unit.

Based on the above, in the memory management method and the storage controller provided in the embodiments of the disclosure, when a specific event occurs, the checking operation is performed on a physical unit so that whether a memory management operation needs to be performed is determined according to a voltage offset value between an optimization read voltage set and a preset read voltage set of the physical unit or according to a sum of Gray code count offset values of the physical unit, so that the memory management operation can be more accurately performed on the physical unit which substantially requires the memory management operation, and further, service life of the rewritable non-volatile memory module can be extended and safety of the data stored therein can be enhanced.

To make the above features and advantages of the disclosure more comprehensible, examples accompanied with drawings are described in detail as follows.

DESCRIPTION OF THE EMBODIMENTS

In the present embodiment, a storage device includes a rewritable non-volatile memory module and a storage device controller (also "storage controller" or "storage control circuit"). In addition, the storage device is used together with a host system, so that the host system writes data to or reads data from the storage device.

Figure 1:
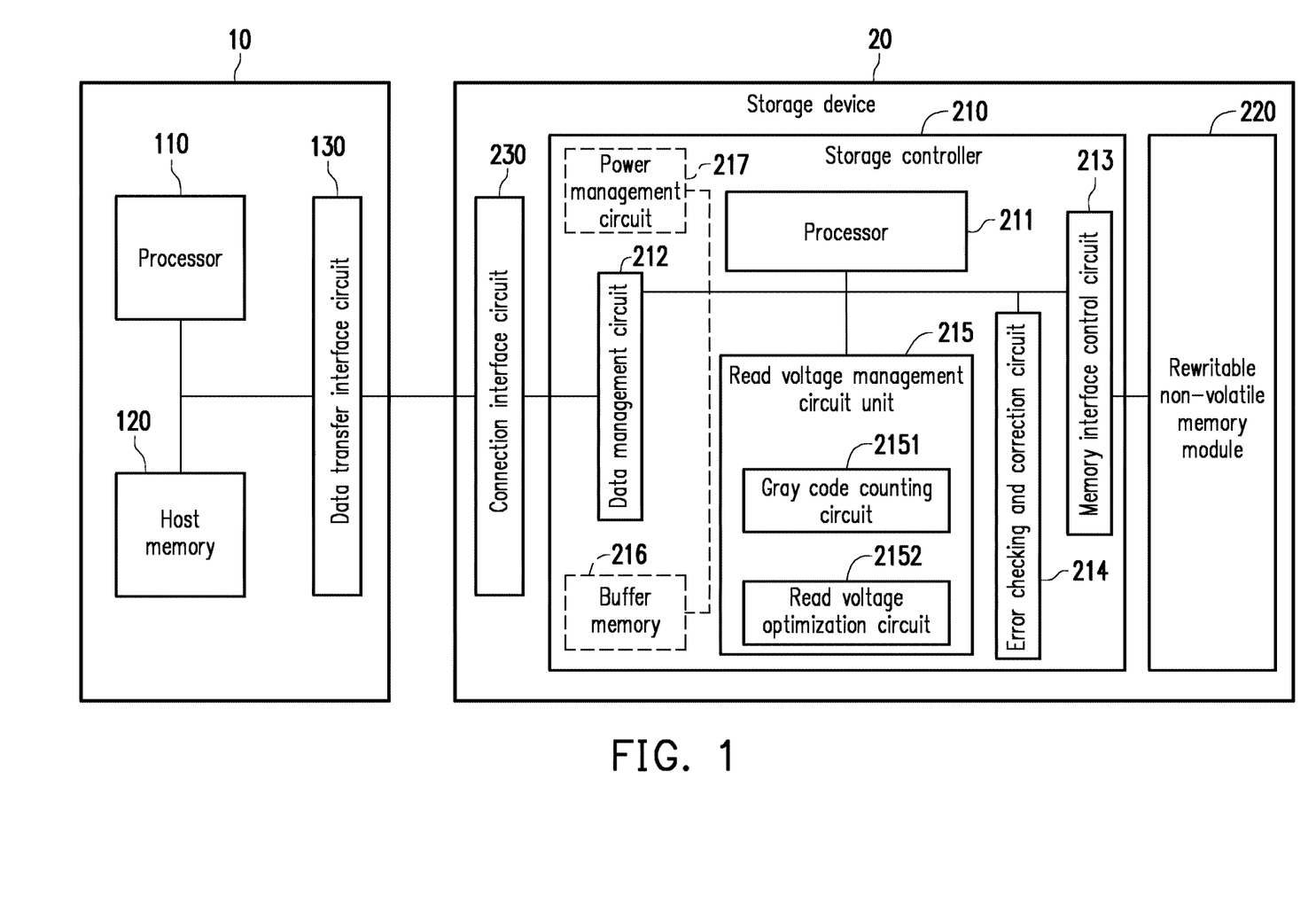
FIG. 1 is a schematic block diagram illustrating a host system and a storage device according to an embodiment of the disclosure.

FIG. 1 is a schematic block diagram illustrating a host system and a storage device according to an embodiment of the disclosure.

Referring to FIG. 1, a host system 10 includes a processor 110, a host memory 120 and a data transfer interface circuit 130. In the present embodiment, the data transfer interface circuit 130 is coupled (also "electrically connected") to the processor 110 and the host memory 120. In another embodiment, the processor 110, the host memory 120 and the data transfer interface circuit 130 are coupled to one another by a system bus.

A storage device 20 includes a storage controller 210, a rewritable non-volatile memory module 220 and a connection interface circuit 230. The storage controller 210 includes a processor 211, a data management circuit 212 and a memory interface control circuit 213.

In the present embodiment, the host system 10 is coupled to the storage device 20 through the data transfer interface circuit 130 and the connection interface circuit 230 of the storage device 20 so as to perform a data access operation. For example, the host system 10 may store data in or read data from the storage device 20 through the data transfer interface circuit 130.

In the present embodiment, the processor 110, the host memory 120 and the data transfer interface circuit 130 may be disposed on a motherboard of the host system 10. The number of the data transfer interface circuit 130 may be one or more. Through the data transfer interface circuit 130, the motherboard may be coupled to the storage device 20 in a wired or wireless manner. The storage device 20 is, for example, a USB flash drive, a memory card, a solid state drive (SSD) or a wireless memory storage device. The wireless memory storage device is, for example, a memory storage device based on various wireless communication techniques, such as a near field communication (NFC) memory storage device, a Wi-Fi memory storage device, a Bluetooth memory storage device, or a low power Bluetooth memory storage device (e.g., iBeacon). In addition, the motherboard may also be coupled to a global positioning system (GPS) module, a network interface card, a wireless transmission device, and various input/output (I/O) devices such as a keyboard, a screen, a speaker or the like, through a system bus.

In the present embodiment, the data transfer interface circuit 130 and the connection interface circuit 230 are interface circuits compatible with the Peripheral Component Interconnect Express (PCI Express) standard. Moreover, data transmission between the data transfer interface circuit 130 and the connection interface circuit 230 is performed using a non-volatile memory express (NVMe) communication protocol.

However, it should be understood that the disclosure is not limited thereto. The data transfer interface circuit 130 and the connection interface circuit 230 may be compliant with a Parallel Advanced Technology Attachment (PATA) standard, an Institute of Electrical and Electronic Engineers (IEEE) 1394 standard, a Serial Advanced Technology Attachment (SATA) standard, a Universal Serial Bus (USB) standard, a Secure Digital (SD) interface standard, an Ultra-High Speed-I (UHS-I) interface standard, an Ultra-High Speed-II (UHS-II) interface standard, a Memory Stick (MS) interface standard, a multi-chip package (MCP) interface standard, a MultiMediaCard (MMC) interface standard, an embedded MultiMediaCard (eMMC) interface standard, a Universal Flash Storage (UFS) interface standard, an embedded multi-chip package (eMCP) interface standard, a CompactFlash (CF) interface standard, an Integrated Drive Electronics (IDE) standard or other suitable standard. In addition, in another embodiment, the connection interface circuit 230 and the storage controller 210 may be packaged into a chip, or the connection interface circuit 230 may be disposed outside a chip that contains the storage controller 210.

In the present embodiment, the host memory 120 is configured to temporarily store a command executed by the processor 110 or data. For example, in the present exemplary embodiment, the host memory 120 may be a dynamic random access memory (DRAM), a static random access memory (SRAM) or the like. Nevertheless, it should be understood that the disclosure is not limited thereto, and the host memory 120 may be other suitable memory.

The storage controller 210 is configured to execute a plurality of logic gates or control commands implemented in hardware form or in firmware form, and to perform operations such as data writing, data reading and data erasing in the rewritable non-volatile memory module 220 according to a command from the host system 10.

More specifically, the processor 211 in the storage controller 210 is hardware capable of computing and is configured to control an overall operation of the storage controller 210. Specifically, the processor 211 has a plurality of control commands. When the storage device 20 is operating, the control commands are executed to perform operations such as data writing, data reading and data erasing.

It is worth mentioning that, in the present embodiment, the processor 110 and the processor 211 are, for example, central processing units (CPUs), micro-processors, or any other programmable processing units, digital signal processors (DSPs), programmable controllers, application specific integrated circuits (ASICs), programmable logic devices (PLDs) or any other similar circuit elements. The disclosure is not limited thereto.

In one embodiment, the storage controller 210 further includes a read-only memory (not illustrated) and a random access memory (RAM) (not illustrated). Specifically, the read-only memory has a boot code. When the storage controller 210 is enabled, the boot code is first executed by the processor 211 for loading the control commands stored in the rewritable non-volatile memory module 220 into the RAM of the storage controller 210. Afterwards, the processor 211 executes the control commands to perform the operations such as data writing, data reading and data erasing. In another embodiment, the control commands of the processor 211 may be stored in the form of program codes in a specific area (e.g., a physical storage unit in the rewritable non-volatile memory module 220 dedicated for storing system data) of the rewritable non-volatile memory module 220.

In the present embodiment, as mentioned above, the storage controller 210 further includes the data management circuit 212 and the memory interface control circuit 213. It should be noted that operations performed by each component of the storage controller 210 may be regarded as operations performed by the storage controller 210 itself.

The data management circuit 212 is coupled to the processor 211, the memory interface control circuit 213 and the connection interface circuit 230. The data management circuit 212 is configured to receive an instruction from the processor 211 to perform data transmission. For example, the data management circuit 212 reads data from the host system 10 (e.g., the host memory 120) through the connection interface circuit 230, and writes the read data to the rewritable non-volatile memory module 220 through the memory interface control circuit 213 (wherein the writing operation is performed according to, for example, a write command from the host system 10). For another example, the data management circuit 212 reads data from one or more physical units of the rewritable non-volatile memory module 220 through the memory interface control circuit 213 (wherein the data may be read from one or more memory cells in the one or more physical units), and writes the read data to the host system 10 (e.g., the host memory 120) through the connection interface circuit 230 (wherein the reading operation is performed according to, for example, a read command from the host system 10). In another embodiment, the data management circuit 212 may be incorporated into the processor 211.

The memory interface control circuit 213 is configured to receive an instruction from the processor 211 to perform a writing operation (also "programming operation"), a reading operation or an erasing operation on the rewritable non-volatile memory module 220 in cooperation with the data management circuit 212.

For example, the processor 211 may execute a write command sequence to instruct the memory interface control circuit 213 to write data to the rewritable non-volatile memory module 220; the processor 211 may execute a read command sequence to instruct the memory interface control circuit 213 to read data from one or more physical units (also "target physical units") of the rewritable non-volatile memory module 220 that correspond to the read command; and the processor 211 may execute an erase command sequence to instruct the memory interface control circuit 213 to perform the erasing operation on the rewritable non-volatile memory module 220. The write command sequence, the read command sequence and the erase command sequence may each contain one or more program codes or command codes, and are for instructing to perform the corresponding operations such as writing, reading and erasing on the rewritable non-volatile memory module 220. In one embodiment, the processor 211 may further give other types of command sequences to the memory interface control circuit 213 so as to perform the corresponding operations on the rewritable non-volatile memory module 220.

In addition, the data to be written to the rewritable non-volatile memory module 220 is converted to a format acceptable to the rewritable non-volatile memory module 220 by the memory interface control circuit 213. Specifically, if the processor 211 desires to access the rewritable non-volatile memory module 220, the processor 211 transmits corresponding command sequences to the memory interface control circuit 213 so as to instruct the memory interface control circuit 213 to perform corresponding operations. These command sequences may include, for example, the write command sequence that instructs to write data, the read command sequence that instructs to read data, the erase command sequence that instructs to erase data, and corresponding command sequences for instructing various memory operations (e.g., changing a plurality of preset read voltage values of a preset read voltage set to perform the reading operation, or executing a garbage collection procedure, and so on). These command sequences may contain one or more signals, or data on a bus. These signals or data may contain command codes or program codes. For example, the read command sequence includes read information such as identification codes, memory addresses and so on.

The rewritable non-volatile memory module 220 is coupled to the storage controller 210 (the memory interface control circuit 213) and is configured to store the data written by the host system 10. The rewritable non-volatile memory module 220 may be a single-level cell (SLC) NAND flash memory module (i.e., a flash memory module in which one memory cell may store one bit of data), a multi-level cell (MLC) NAND flash memory module (i.e., a flash memory module in which one memory cell may store two bits of data), a triple-level cell (TLC) NAND flash memory module (i.e., a flash memory module in which one memory cell may store three bits of data), a quadruple-level cell (QLC) NAND flash memory module (i.e., a flash memory module in which one memory cell may store four bits of data), other flash memory module such as a 3D NAND flash memory module or a vertical NAND flash memory module, or other memory module having the same characteristics. The memory cells in the rewritable non-volatile memory module 220 are disposed in array.

In the present embodiment, the rewritable non-volatile memory module 220 has a plurality of word-lines, wherein each of the word-lines includes a plurality of memory cells. The memory cells on the same word-line compose one or more physical programming units (physical pages). In addition, a plurality of physical programming units may compose one physical unit (which is a physical block or a physical erasure unit). In the present embodiment, taking a TLC NAND flash memory module as an example, i.e., in the following embodiment, one memory cell capable of storing three bits of data is used as one physical programming unit (i.e., in each programming operation, a programming voltage is applied to the physical programming units one after another to program the data), wherein each memory cell is divided into a lower physical page, a middle physical page and an upper physical page each of which is capable of storing one bit value.

In the present embodiment, memory cell is used as the minimum unit for writing (programming) data. Physical unit is the minimum unit for erasure. That is, each physical unit has a minimum number of memory cells to be erased together. Each physical unit has a plurality of memory cells. In the following embodiment, an example is given in which one physical block is used as one physical unit. However, in another embodiment, one physical unit may refer to the composition of an arbitrary number of memory cells, depending on practical needs. In addition, it should be understood that, when the processor 211 performs grouping on the memory cells (or physical units) in the rewritable non-volatile memory module 220 in order to perform corresponding management operations, the memory cells (or physical units) are logically grouped and do not change their actual positions.

It should be noted that, in the present embodiment, the system data for recording information of a physical unit may be recorded using one or more memory cells in the physical unit, or using one or more memory cells of a specific physical unit in a system area for recording all the system data. In the present embodiment, the system data corresponding a physical unit contains information, such as a program erase cycle (PEC) count, a data retention timestamp (DRT) and a read countervalue, of the physical unit. More specifically, whenever the processor 211 performs the erasing operation on a physical unit, after completing the erasing operation, the processor 211 adds 1 to a program erase cycle count currently corresponding to the physical unit (e.g., the program erase cycle count is increased from 0 along with each erasing operation). That is, the program erase cycle count reflects the total number of times that the corresponding physical unit is erased.

The data retention timestamp indicates retention time of data stored in the corresponding physical unit. Magnitudes (numerical value differences) of the timestamps may reflect a temporal sequence. The disclosure does not limit detailed formats of the timestamps. Whenever performing the writing operation on the physical unit, the processor 211 updates the data retention timestamp of the physical unit to a current time of the storage device at which the physical unit performs the writing operation. That is, the data retention timestamp corresponding to a physical unit indicates the last time the writing operation was performed on the physical unit (e.g., the local time when the last writing operation was completed). The writing operation is performed by, for example, programming data to one or more memory cells of the physical unit, or by, for example, programming data to other types of physical addresses of the physical unit. Next, according to the data retention timestamp, the processor 211 calculates how long the data in the physical unit has been retained since the previous writing operation.

For example, in the present embodiment, the processor 211 may further calculate a retention time value of a physical unit according to the current time of the storage device and the data retention timestamp of the physical unit. The retention time value indicates a time length between the last time data was written to the physical unit and the current time. That is, the greater the retention time value of a physical unit, the longer the data stored in the physical unit has been retained. Moreover, this data is never accessed or updated during the retention time.

The read counter value indicates the number of times the corresponding physical unit has been read, and the read counter value will be cleared when the corresponding physical unit is erased.

In the present embodiment, according to statistics of a plurality of physical units of the rewritable non-volatile memory module 220, the processor 211 classifies the physical units into a plurality of physical unit groups. The statistics include one or a combination of the aforesaid information such as program erase cycle count, data retention timestamp and read counter value. The physical units classified into the same physical unit group have closer physical characteristics. The processor 211 performs data reading on the physical units classified into the same physical unit group through the same read voltage set (e.g., by giving the read command sequence using the same read voltage set, so as to perform the reading operation on the physical units belonging to the same physical unit group). In addition, the processor 211 further performs the same kind of memory management operation (e.g., wear leveling operation, garbage collection operation, data merging operation and so on) on the physical units classified into the same physical unit group. For example, in the present embodiment, the physical units are grouped based on the data retention timestamp. Therefore, the physical units classified into the same physical unit group have close data retention timestamps. In this case, if the processor 211 determines that a memory management operation such as a wear leveling operation needs to be performed on a physical unit in a physical unit group, the same memory management operation may also need to be performed on the other physical units in the physical unit group.

In other embodiments, according to the statistics of a plurality of word-lines of the rewritable non-volatile memory module 220, the processor 211 classifies the word-lines into a plurality of word-line groups (wherein the processor 211 obtains the statistics of each word-line). Moreover, the word-lines classified into the same word-line group have closer physical characteristics. It should be noted that the following embodiment describes a scenario in which a plurality of physical units are classified into a plurality of physical unit groups according to the data retention timestamp.

The storage controller 210 allocates a plurality of logical units to the rewritable non-volatile memory module 220. The host system 10 accesses user data stored in a plurality of physical units through the allocated logical units. Here, each logical unit may be composed of one or more logical addresses. For example, the logical units may be logical blocks, logical pages or logical sectors. One logical unit may be mapped to one or more physical units, wherein the physical unit may be one or more physical addresses, one or more physical sectors, one or more physical programming units, or one or more physical erasure units. In the present embodiment, the logical units are logical blocks, and logical subunits are logical pages. Each logical unit has a plurality of logical subunits.

In addition, the storage controller 210 establishes a logical-to-physical address mapping table and a physical-to-logical address mapping table so as to record mapping relationships between the logical units (e.g., logical blocks, logical pages, or logical sectors) allocated to the rewritable non-volatile memory module 220 and the physical units (e.g., physical erasure units, physical programming units, or physical sectors). In other words, the storage controller 210 looks up a physical unit to which a logical unit is mapped according to the logical-to-physical address mapping table, and looks up a logical unit to which a physical unit is mapped according to the physical-to-logical address mapping table. However, the above-mentioned technical concept relating to the mapping between logical unit and physical unit is a common technical means for persons skilled in the art and will not be described in detail herein.

In the present embodiment, an error checking and correction circuit 214 is coupled to the processor 211 and is configured to execute an error checking and correcting procedure to ensure accuracy of data. Specifically, when the processor 211 receives a write command from the host system 10, the error checking and correction circuit 214 generates a corresponding error correcting code (ECC) and/or error detecting code (EDC) for the data corresponding to the write command. Moreover, the processor 211 writes the data corresponding to the write command, the corresponding ECC and/or EDC to the rewritable non-volatile memory module 220. After that, when the processor 211 reads data from the rewritable non-volatile memory module 220, the ECC and/or EDC corresponding to the data is also read by the processor 211 at the same time. Moreover, the error checking and correction circuit 214 executes the error checking and correcting procedure for the read data based on the ECC and/or EDC. In addition, after the error checking and correcting procedure, if the read data is successfully decoded, the error checking and correction circuit 214 returns the number of error bits that corresponds to the read data to the processor 211. According to the number of error bits of the read data, the processor 211 learns of a degree of instability (degree of aging) of a physical unit for storing the read data.

In one embodiment, the storage controller 210 further includes a buffer memory 216 and a power management circuit 217. The buffer memory 216 is coupled to the processor 211 and is configured to temporarily store data and commands from the host system 10, data from the rewritable non-volatile memory module 220 or system data for managing the storage device 20, so that the processor 211 can promptly access the data, commands or system data from the buffer memory 216. The power management circuit 217 is coupled to the processor 211 and is configured to control a power of the storage device 20.

In the present embodiment, a read voltage management circuit unit 215 includes a Gray code counting circuit 2151 and a read voltage optimization circuit 2152. The read voltage management circuit unit 215 is configured to perform management on a read voltage of a plurality of physical units or/and a plurality of word-lines.

More specifically, the processor 211 selects one of a plurality of physical units of the rewritable non-volatile memory module 220 and performs a read voltage optimization operation corresponding to the physical unit at a specific time point.

For example, the processor 211 may select a target physical unit from all the physical units and perform the read voltage optimization operation thereon (1) when the storage device 20 is idling (i.e., when the storage device 20 has been idle for longer than a predetermined idle time threshold); (2) when the storage device 20 is powered on; or (3) when the number of error bits of the data read from a physical unit has exceeded an error bit number threshold value. In addition, the processor 211 may select the target physical unit according to the number of error bits returned from the error checking and correction circuit 214. Specifically, when the number of error bits of the data read from a physical unit has exceeded an error bit number threshold value, the physical unit is set as the target physical unit. It should be noted that the selected target physical unit has stored data therein, i.e., data has been programmed therein. In addition, if the read voltage optimization operation corresponding a target physical unit has been completed and an optimization read voltage set corresponding to the target physical unit has been obtained, the read voltage management circuit unit 215 records the optimization read voltage set corresponding to the target physical unit.

In one embodiment, the processor 211 performs the read voltage optimization operation on a word-line, and records an optimization read voltage set corresponding to the word-line.

Hereinafter, a memory management method provided by the present embodiment is described in detail with reference to several drawings.

Figure 2:
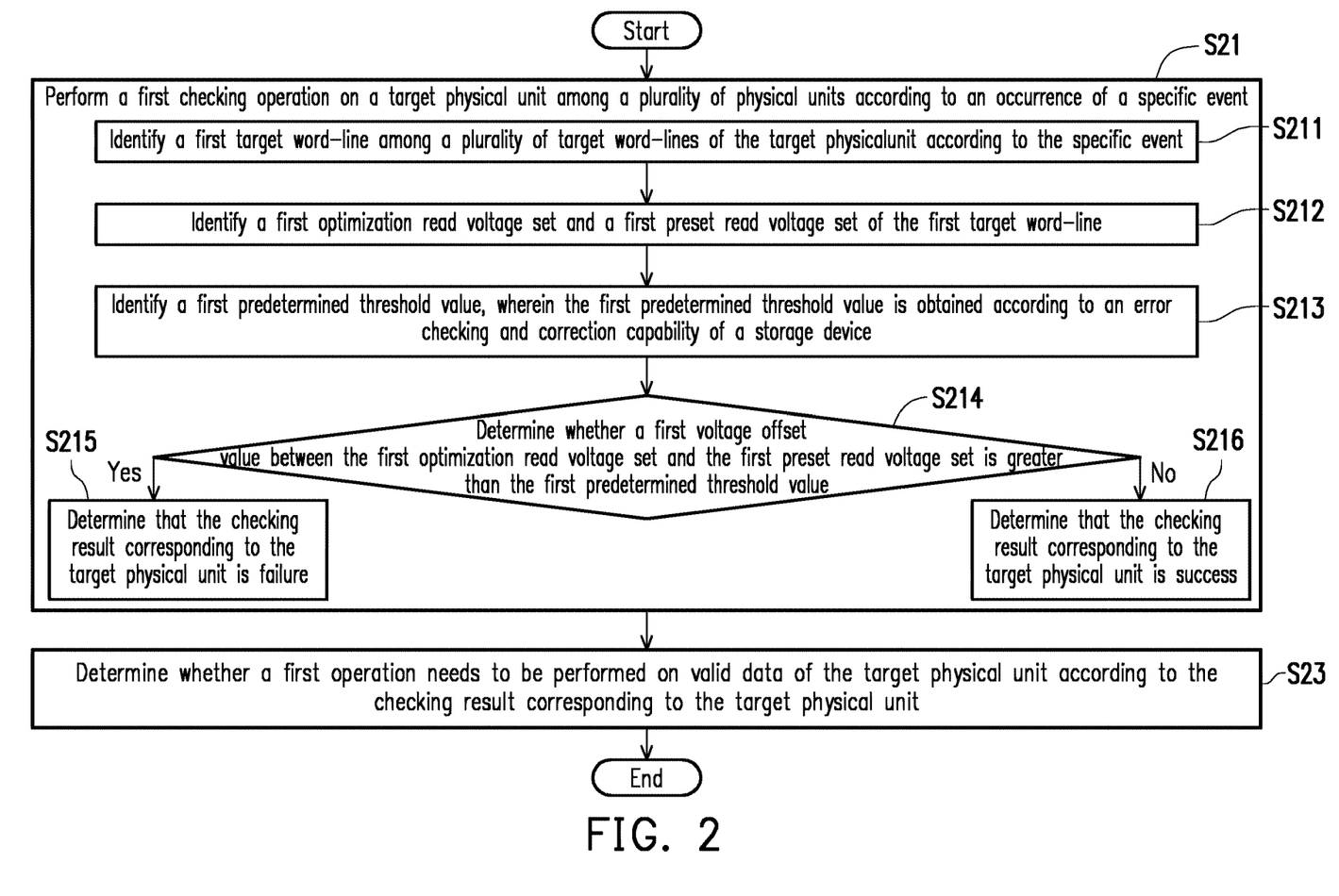
FIG. 2 is a flowchart illustrating a memory management method according to an embodiment of the disclosure.

FIG. 2 is a flowchart illustrating a memory management method according to an embodiment of the disclosure. Referring to FIG. 1 and FIG. 2 together, in step S21, the processor 211 performs a first checking operation on a target physical unit among a plurality of physical units according to an occurrence of a specific event. Specifically, in the present embodiment, the target physical unit is checked using two kinds of checking operations (i.e., the first checking operation using a voltage offset value between an optimization read voltage set and a preset read voltage set, and a second checking operation), so that whether to perform a memory management operation (also "first operation") on the target physical unit is determined according to a corresponding checking result.

In the present embodiment, the specific event at least includes the following events (1) to (3). Event (1): A first optimization read voltage set is obtained by completely performing a read voltage optimization operation corresponding to a target word-line or the target physical unit, wherein the first checking operation is performed in response to the obtained first optimization read voltage set. Specifically, in the present embodiment, after an optimization read voltage set is obtained, the first checking operation using the optimization read voltage set is performed at the same time, so that whether to perform the first operation on a physical unit/word-line corresponding to the optimization read voltage set is determined.

Event (2): A retention time value of one of the plurality of physical units is greater than a retention time threshold value, wherein the physical unit is set as the target physical unit, and the retention time value of the physical unit is calculated according to the current time of the storage device and a timestamp or a checking timestamp of the physical unit. Specifically, as mentioned above, the retention time value of each physical unit is calculated according to the current time of the storage device and the data retention timestamp of the physical unit. Moreover, the calculated retention time value indicates a period of time for which the data stored in the physical unit has been retained and has not been accessed. In the present embodiment, the assumed scenario is as follows. The longer the period of time for which data stored in a physical unit has been retained and has not been accessed, the more likely a phenomenon of retention error (also "retention phenomenon") is to occur. If the retention phenomenon occurs in a physical unit/word-line that has stored data therein, deviation may occur in a threshold voltage distribution of a plurality of memory cells of the physical unit/word-line, resulting in that bit values stored in the memory cells cannot be correctly read through the preset read voltage set. That is, the number of error bits of the data stored in the physical unit/word-line may become very large, and may even go beyond an error checking and correction capability of the error checking and correction circuit 214. The error checking and correction capability indicates a maximum number of error bits that the error checking and correction circuit 214 is capable of correcting. That is, if the retention time of data stored in a physical unit is very long, the number of error bits of the data may thus go beyond the error checking and correction capability of the error checking and correction circuit 214, and then the error checking and correction circuit 214 is unable to perform error checking and correction on the data, resulting in the occurrence of an error when the data is read. Therefore, when the processor 211 discovers that the retention time value of a physical unit is greater than a specific time (e.g., the retention time threshold value), the processor 211 determines that event (2) has occurred and sets the physical unit as the target physical unit on which a checking operation is to be performed, so as to determine whether the corresponding memory management operation needs to be performed on the target physical unit according to a result of the checking operation.

Event (3): When a counter value of the storage device has accumulated to a checking count value, wherein the counter value increases with operating time of the storage device, in response to the fact that the counter value has accumulated to the checking count value, the counter value is returned to zero and a physical unit having the greatest retention time value is selected as the target physical unit on which the first checking operation is performed. Specifically, in the present embodiment, the processor 211 periodically performs a checking operation according to a counter of the storage controller 210. That is, the counter causes the counter value to accumulate over time. When the accumulating counter value reaches a checking count value corresponding to a period, the counter notifies the processor 211 to perform the checking operation and clears the accumulating counter value. When the processor 211 periodically performs the checking operation corresponding to event (3), the processor 211 selects from all the physical units the physical unit having the greatest retention time value as the target physical unit according to the retention time value, or selects a plurality of physical units having greater retention time values as the target physical unit according to the retention time value. The disclosure is not limited to whether an accumulating counter or a countdown counter is used.

Below, details of the first checking operation are described with reference to steps S211 to S216 illustrated in FIG. 2.

Referring to FIG. 2, in step S211, according to the specific event, the processor 211 identifies a first target word-line among a plurality of target word-lines of the target physical unit. Specifically, as mentioned above, depending on different specific events, the processor 211 selects the target physical unit according to different conditions, so as to perform the first checking operation on the target physical unit. In addition, the processor 211 first selects one or more word-lines among a plurality of word-lines (also "target word-lines") of the target physical unit as the first target word-line. In the present embodiment, the processor 211 selects a word-line of the target physical unit which first has data written thereto as the first target word-line.

In the present embodiment, the first target word-line has stored data therein. Specifically, the memory cells of each word-line are configured to be programmed for storing a bit value corresponding to one of a plurality of different Gray codes, and the total number of the Gray codes is N. It should be noted that, according to the type of the rewritable non-volatile memory module 220, N may be a predetermined positive integer (also "first predetermined positive integer") greater than 2. For example, if the rewritable non-volatile memory module 220 is of the MLC type, N=4; if the rewritable non-volatile memory module 220 is of the SLC type, N=2; and if the rewritable non-volatile memory module 220 is of the QLC type, N=16. In other words, the memory cells of the first target word-line may have stored bit values respectively corresponding to different Gray codes. Other details relating to the Gray codes will be described later with reference to FIG. 4.

Next, in step S212, the processor 211 identifies the first optimization read voltage set and a first preset read voltage set of the first target word-line. Specifically, a preset read voltage set is set by the manufacturer before the product leaves the factory, and the processor 211 performs the reading operation using the preset read voltage set so as to read data from a physical unit of the rewritable non-volatile memory module 220. However, as time passes, the preset read voltage set which was originally applicable in the physical unit may become no longer applicable. Moreover, the processor 211 instructs the read voltage management circuit unit 215 to perform the read voltage optimization operation on the physical unit (or word-line) so as to obtain the optimization read voltage set and record it in the read voltage management circuit unit 215. That is, the processor 211 reads the recorded first optimization read voltage set corresponding to the first target word-line through the read voltage management circuit unit 215.

Next, in step S213, the processor 211 identifies a first predetermined threshold value, wherein the first predetermined threshold value is obtained according to the error checking and correction capability of the storage device.

Specifically, the processor 211 calculates a test range according to the maximum number of error bits, wherein an upper limit of the test range is obtained by multiplying the maximum number of error bits by a first parameter (e.g., 0.55), and a lower limit of the test range is obtained by multiplying the maximum number of error bits by a second parameter (e.g., 0.5) (e.g., the upper limit would be 0.55 times of the maximum number of error bits, and the lower limit would be 0.5 times of the maximum number of error bits). The first and second parameters are numerical values smaller than 1 and greater than zero, and the second parameter is smaller than the first parameter. The test range is smaller than the range of the maximum number of error bits.

Next, the processor 211 sets a plurality of different test read voltage sets, and reads test data from a test word-line using each of the test read voltage sets, so as to obtain a plurality of pieces of read test data. The test word-line is a specific word-line determined by the processor 211 to have good physical conditions (e.g., the number of error bits obtained therefrom through the preset read voltage set is extremely small). Each of the test read voltage sets has different patterns/magnitudes of read voltages. An explanation is given below with reference to FIG. 3.

Figure 3:
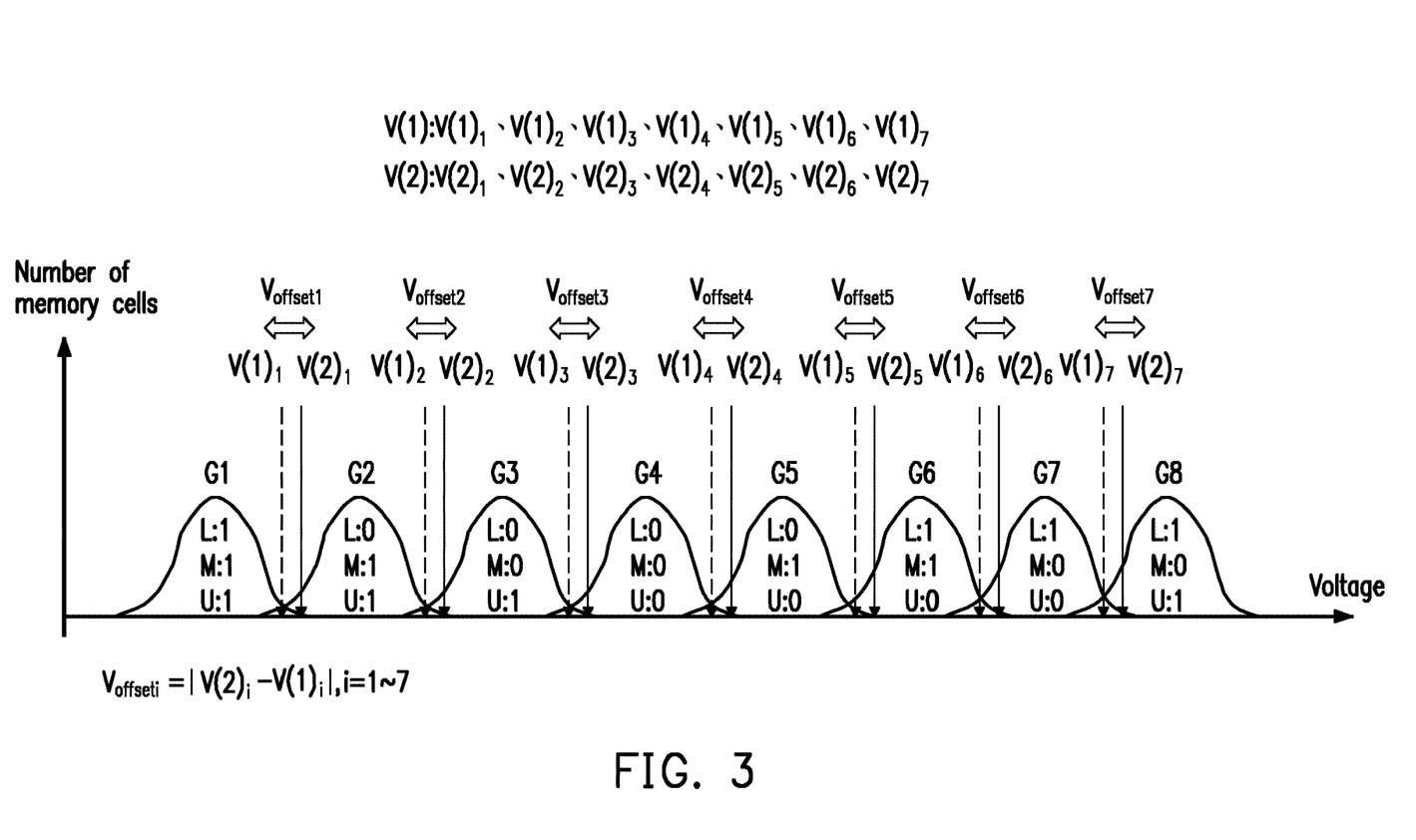
FIG. 3 is a schematic diagram illustrating two different read voltage sets and voltage offset values therein according to an embodiment of the disclosure.

FIG. 3 is a schematic diagram illustrating two different read voltage sets and voltage offset values therein according to an embodiment of the disclosure.

For example, referring to FIG. 3, it is assumed that a first test read voltage set V(1) is the first test read voltage set (e.g., the preset read voltage set) of the test read voltage sets, and a second test read voltage set V(2) is the second test read voltage set of the test read voltage sets. Between these two read voltage sets, voltage offset values between the read voltages having the same rank are not necessarily the same.

For example, a voltage offset value $V_{offset1}$ between the first test read voltage $V(2)_1$ of the second test read voltage set $V(2)$ and the first test read voltage $V(1)_1$ of the first test read voltage set $V(1)$ corresponding thereto is not necessarily equal to a voltage offset value $V_{offset2}$ between the second test read voltage $V(2)_2$ of the second test read voltage set $V(2)$ and the second test read voltage $V(1)_2$ of the first test read voltage set $V(1)$ corresponding thereto. In other words, the manufacturer may design in advance a plurality of test read voltage sets for testing, wherein a plurality of read voltages in each test read voltage set have different distribution patterns/magnitudes.

It should be noted that, in one embodiment, a voltage offset value between two read voltages having corresponding rank can be calculated by the following formula:

$$V_{offseti} = |V(2)_i - V(1)_i|, \text{ wherein } i=1 \text{ to } 7.$$

In the above, i represents the rank of a read voltage in a read voltage set that the read voltage belongs to, and $V(2)$ and $V(1)$ represent two read voltage sets for calculating the voltage offset value. In brief, the voltage offset value corresponding to the two read voltages is an absolute value of a voltage difference between the two read voltages.

The processor 211 further identifies a plurality of numbers of test error bits of the plurality of pieces of read test data (when the same data is read by using different test read voltage sets, after the read data is decoded, the corresponding different numbers of error bits are obtained), so as to find out the first predetermined threshold value according to the plurality of numbers of test error bits and the test range. In detail, the processor 211 identifies a first number of test error bits within the test range among the plurality of numbers of test error bits, wherein the first number of test error bits is obtained according to first read test data read through the first test read voltage set among the test read voltage sets. That is, the processor 211 uses, as a reference, a test read voltage set having a number of error bits within the test range.

Next, a sum of plurality of voltage offset values between a plurality of first test read voltages of the first test read voltage set and a plurality of preset read voltages (also "second preset read voltages") of the preset read voltage set (also "second preset read voltage set") of the test word-line corresponding thereto is used as the first predetermined threshold value. The second preset read voltage set may be equal to the aforesaid first preset read voltage set.

For example, referring to FIG. 3, it is assumed that the read voltage set $V(2)$ is the second preset read voltage set, and the read voltage set $V(1)$ is the first test read voltage set. The processor 211 calculates a plurality of voltage offset values $V_{offset1}$ to $V_{offset7}$ between the read voltages having the same rank in the second preset read voltage set $V(2)$ and the first test read voltage set $V(1)$, and calculates a sum of the voltage offset values $V_{offset1}$ to $V_{offset7}$ to use it as the first predetermined threshold value.

In addition, in one embodiment, the processor 211 further uses an average value of the plurality of voltage offset values between the plurality of first test read voltages of the first test read voltage set and the plurality of second preset read voltages of the second preset read voltage set of the test word-line corresponding thereto as a second predetermined threshold value. Following the aforesaid example, the second predetermined threshold value may be obtained by dividing the first predetermined threshold value by 7 (e.g., N−1) (because the first predetermined threshold value is the sum of the seven voltage offset values $V_{offset1}$ to $V_{offset7}$).

In other words, in the present embodiment, the concept of calculating the first predetermined threshold value/the second predetermined threshold value is to read a word-line having a threshold voltage distribution compliant with a preset read voltage set by using a read voltage set offset from the preset read voltage set by a certain voltage offset value, so as to obtain the number of error bits within the test range. It can be further inferred that, if the optimization read voltage set of a word-line is also offset from the original preset read voltage set of the word-line by the certain voltage offset value, it means that, the number of error bits within the test range is expected to be obtained if the word-line continues to be read by using the preset read voltage set.

That is, based on the error checking and correction capability, the manufacturer may design the test range to be lower than the error checking and correction capability and set the corresponding first and second predetermined threshold values, so as to prevent the number of error bits of the target physical unit/target word-line from going beyond the error checking and correction capability.

Please refer back to FIG. 2. Next, in step S214, the processor 211 determines whether a first voltage offset value between the first optimization read voltage set and the first preset read voltage set is greater than the first predetermined threshold value. The first voltage offset value between the first optimization read voltage set and the first preset read voltage set is a sum of a plurality of voltage offset values between a plurality of first optimization read voltages of the first optimization read voltage set and a plurality of first preset read voltages of the first preset read voltage set that respectively correspond to the first optimization read voltages.

If the first voltage offset value between the first optimization read voltage set and the first preset read voltage set is greater than the first predetermined threshold value, the process continues to step S215, and the processor 211 determines that a checking result corresponding to the target physical unit is failure. If the first voltage offset value between the first optimization read voltage set and the first preset read voltage set is not greater than the first predetermined threshold value, the process continues to step S216, and the processor 211 determines that the checking result corresponding to the target physical unit is success. After the checking result is determined, the first checking operation is completed.

Next, in step S23, the processor 211 determines whether the first operation needs to be performed on valid data in the target physical unit according to the checking result corresponding to the target physical unit. Specifically, in response to the checking result determined to be success, the processor 211 determines that the first operation does not need to be performed on the valid data in the target physical unit, and records a checking timestamp of the target physical unit that corresponds to the first checking operation. In the present embodiment, if a physical unit has a checking timestamp, the retention time value of the physical unit is calculated using the current time and the checking timestamp.

By contrast, in response to the checking result determined to be failure, the processor 211 determines that the first operation needs to be performed on the valid data in the target physical unit, and performs the first operation.

In addition, in another embodiment, one condition is further set to avoid frequently performing the first operation. Specifically, in the operation during which the processor 211 determines whether the first operation needs to be performed on the valid data in the target physical unit according to the checking result corresponding to the target physical unit, in response to the checking result determined to be failure, the processor 211 further determines whether a number of pieces of valid data in the target physical unit is greater than a valid data threshold value. The number of pieces of valid data indicates size of the valid data in the target physical unit. By comparing the number of pieces of valid data with the valid data threshold value, a ratio of the valid data in the target physical unit to overall space/invalid data in the target physical unit is determined.

Next, if the number of pieces of valid data is not greater than the valid data threshold value, the processor 211 determines that the first operation needs to be performed on the valid data in the target physical unit. By contrast, if the number of pieces of valid data is greater than the valid data threshold value, the processor 211 determines that the first operation does not need to be performed on the valid data in the target physical unit, and replaces the first predetermined threshold value with a third predetermined threshold value for the next first checking operation to be performed on the target physical unit, wherein the third predetermined threshold value is greater than the first predetermined threshold value. Specifically, if the number of pieces of valid data is greater than the valid data threshold value (which means that the size of the valid data in the target physical unit is larger than a certain degree), the processor 211 considers that the first operation does not need to be performed on this target physical unit for the moment, and keeps a record of this situation, so that next time when the first checking operation is performed on the same target physical unit, only if the first voltage offset value between the optimization read voltage set and the preset read voltage set at that moment is greater than the greater third predetermined threshold value, the processor 211 determines that the checking result is failure.

The above technical concept lies in that, in some specific cases such as a case where the storage device stored data and was not turned on again until one year later, most physical units would have huge retention time values (and the optimization read voltage would be far from the preset read voltage set), resulting in that too many first operations are triggered, and access efficiency of the system is thus lowered by the triggering of the first operations. Therefore, the disclosure further uses the number of pieces of valid data as a condition for determining whether to perform the first operation.

It is worth mentioning that, in some cases, if a physical unit has never undergone the read voltage optimization operation (the processor 211 has not identified the optimization read voltage set of the physical unit), the processor 211 replaces the first checking operation with a second checking operation.

The second checking operation includes the following steps (1) to (3).

Step (1): The first target word-line is read by using the first preset read voltage set so as to obtain a sum of Gray code count offset values. Specifically, the processor 211 instructs the read voltage management circuit unit 215 to read the first target word-line to obtain a plurality of read bit values, and calculates, by the Gray code counting circuit 2151, Gray code count values of the read data that respectively correspond to a plurality of Gray codes.

Figure 4:
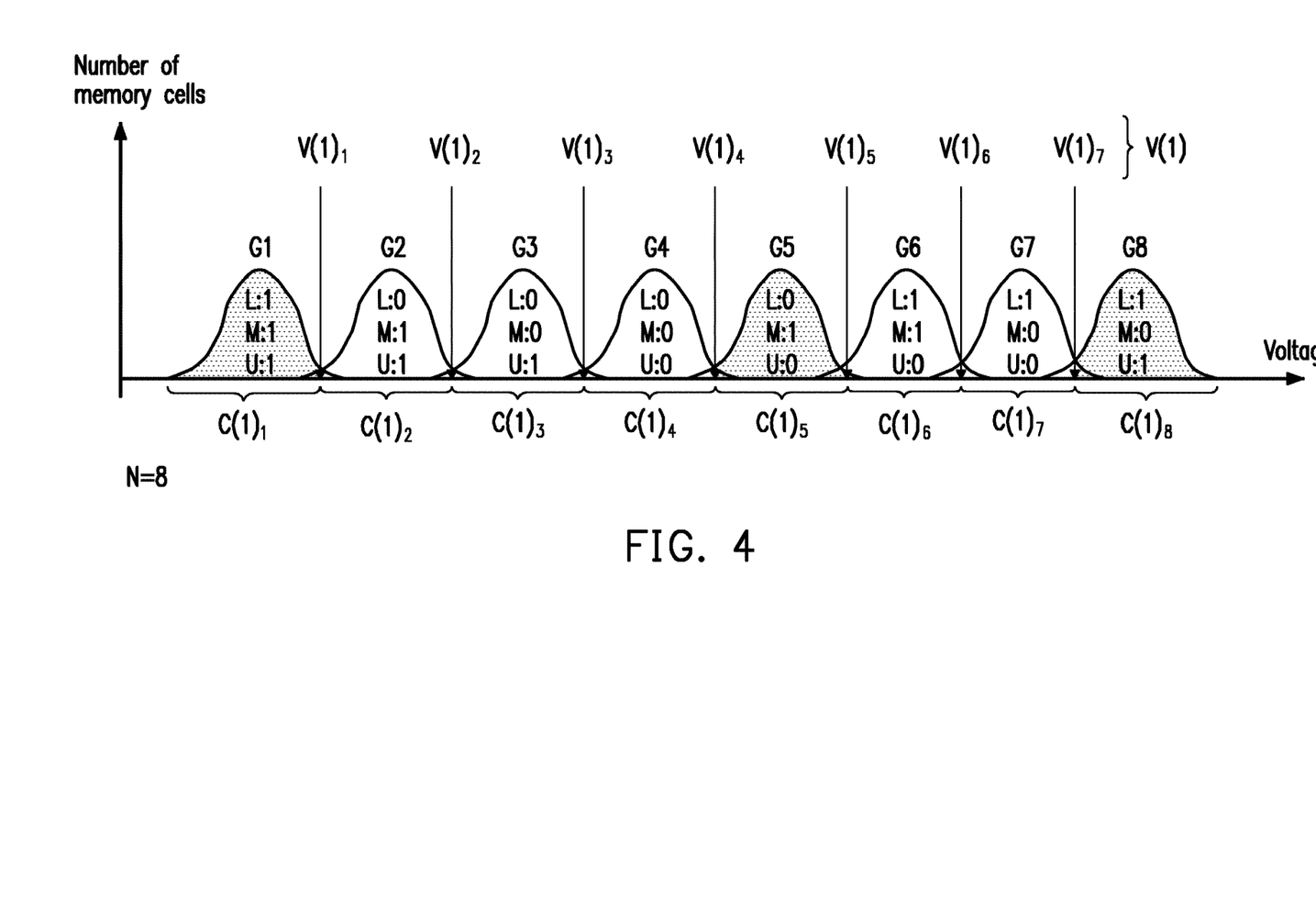
FIG. 4 is a schematic diagram illustrating a threshold voltage distribution of a plurality of memory cells storing bit values corresponding to N Gray codes read through a first preset read voltage set and a plurality of Gray code count values corresponding thereto.

FIG. 4 is a schematic diagram illustrating a threshold voltage distribution of a plurality of memory cells storing bit values corresponding to N Gray codes read through a first preset read voltage set and a plurality of Gray code count values corresponding thereto. Since the present embodiment gives an example using a TLC NAND flash memory module, N is equal to 8 (i.e., $2^3$, wherein the power is "three" from the triple-level cell). In the TLC NAND flash memory module, each memory cell has three physical pages for respectively storing bit data, wherein the each memory cell includes a lower physical page (L), a middle physical page (M) and an upper physical page (U) each capable of storing one bit value. It is assumed that the read voltage management circuit unit 215 (or the Gray code counting circuit 2151) reads a plurality of memory cells (target memory cells) of a target word-line of the TLC NAND flash memory module through a plurality of read voltages $V(1)_1$ to $V(1)_7$ of the first preset read voltage set $V(1)$, and accordingly identifies different bit values (bit values respectively corresponding to different Gray codes) stored in the memory cells. According to the read voltages $V(1)_1$ to $V(1)_7$ of the first preset read voltage set $V(1)$, a gate voltage in each memory cell is classified into eight different Gray codes, such as "L:1 M:1 U:1", "L:0 M:1 U:1", "L:0 M:0 U:1", "L:0 M:0 U:0", "L:0 M:1 U:0", "L:1 M:1 U:1", "L:1 M:0 U:0" and "L:1 M:0 U:1" (wherein "L:" indicates the bit value of the lower physical page; "M:" indicates the bit value of the middle physical page; and "U:" indicates the bit value of the upper physical page). The eight different Gray codes may also be expressed as eight different bit value combinations such as "111", "011", "001", "000", "010", "111", "100" and "101", wherein the order of the bit values in each bit value combination is based on the order of the lower physical page, the middle physical page and the upper physical page. That is, by respectively applying the read voltages $V(1)_1$ to $V(1)_7$ of the first preset read voltage set $V(1)$ that have different voltage values to one memory cell of the first target word-line, the read voltage management circuit unit 215 (or the Gray code counting circuit 2151) is able to determine that the bit value (also "bit data" or "read bit value") stored in the memory cell corresponds to one of the different Gray codes ("111", "011", "001", "000", "010", "111", "100" or "101") by determining whether a channel of the memory cell is turned on (i.e., reading the read bit value from one memory cell of the first target word-line by using the first preset read voltage set $V(1)$). For example, the read voltage $V(1)_1$ may differentiate between the Gray code "111" and the Gray code "011" (the left side of the read voltage $V(1)_1$ corresponds to the threshold voltage distribution of the Gray code "111"; the right side of the read voltage $V(1)_1$ corresponds to the threshold voltage distribution of the Gray code "011"). It should be noted that, the number (7 in this example) of the read voltages of each read voltage set is obtained by subtracting 1 from the number (8 in this example) of the Gray codes the memory cells of the rewritable non-volatile memory module 220 may have (i.e., N−1=8−1=7).

After all the Gray code count values of the first target word-line are obtained, the read voltage management circuit unit 215 (or the Gray code counting circuit 2151) subtracts one Gray code count standard value from each of all the Gray code count values to obtain eight differences, and uses the eight differences as eight Gray code count offset values corresponding to the first preset read voltage set $V(1)$.

In the present embodiment, the Gray code count standard value is set according to a total quantity (also "read memory cells amount") of the read target memory cells. For example, the total quantity of the read target memory cells is 18592*8 (in this example, the read target memory cells include the memory cells for storing user data of 16 kilobytes and the memory cells for storing system data of 2208 kilobytes). The value "18592" in "18592*8" mentioned above is also referred to a Gray code count standard value (which may be expressed as $C_{std}$) or a Gray code count average value (which may be expressed as $C_{avg}$). In other words, the Gray code count standard value is obtained by dividing the number of the read memory cells by N, wherein the value of N is set in advance according to physical specifications of the memory as mentioned above. For example, MLC: N=4; TLC: N=8; and QLC: N=16.

After N Gray code count offset values corresponding to the i-th read voltage set are obtained, the read voltage management circuit unit 215 (or the Gray code counting circuit 2151) calculates a sum of all the Gray code count offset values, and uses the sum as a sum of the Gray code count offset values corresponding to the first preset read voltage set V(1).

Step (2): An offset threshold value is identified, wherein the offset threshold value is obtained according to the error checking and correction capability of the storage device. Specifically, similarly to the aforesaid concept of setting the first/second predetermined threshold value, the processor 211 may obtain the sum of the Gray code count offset values of the first test read voltage set using the test voltage, and uses the sum as the offset threshold value.

Step (3): Whether the sum of the Gray code count offset values is greater than the offset threshold value is determined, wherein, if the sum of Gray code count offset values is greater than the offset threshold value, it is determined that the checking result corresponding to the target physical unit is failure; if the sum of Gray code count offset values is not greater than the offset threshold value, it is determined that the checking result corresponding to the target physical unit is success.

In this way, the processor 211 may determine whether to perform the first operation on the target physical unit according to the checking result obtained by performing the second checking operation. It should be noted that, in other embodiments, the processor 211 may directly determine whether to perform the first operation on the target physical unit by performing the second checking operation first.

It should be noted that the spirit of the disclosure lies in providing a memory management method different from the related art, wherein a voltage offset value between the optimization read voltage set and the preset read voltage set of a physical unit or the sum of the Gray code count offset values is used as a reference standard in determining whether a memory management operation (also "data management operation") needs to be performed on data stored in the physical unit. In this process, the physical unit on which the memory management operation needs to be performed can be accurately identified without reference to the program erase cycle count or number of error bits of the physical unit.

In summary, in the memory management method and the storage controller provided in the embodiments of the disclosure, when a specific event occurs, the checking operation is performed on a physical unit so that whether a memory management operation needs to be performed is determined according to the voltage offset value between the optimization read voltage set and the preset read voltage set of the physical unit or according to the sum of Gray code count offset values of the physical unit, so that the memory management operation can be more accurately performed on the physical unit which substantially requires the memory management operation, and further, service life of the rewritable non-volatile memory module can be extended and safety of data stored therein can be enhanced.

Although the disclosure has been described with reference to the above examples, it will be apparent to one of ordinary skill in the art that modifications to the described examples may be made without departing from the spirit of the disclosure. Accordingly, the scope of the disclosure will be defined by the attached claims and not by the above detailed descriptions.

What is claimed is:

1. A memory management method adapted for a storage device having a rewritable non-volatile memory module, wherein the rewritable non-volatile memory module comprises a plurality of physical units, and each of the physical units has a plurality of word-lines, the memory management method comprising:
    performing a first checking operation on a target physical unit among the physical units according to an occurrence of a specific event, comprising:
        identifying a first target word-line among a plurality of target word-lines of the target physical unit according to the specific event;
        identifying a first optimization read voltage set and a first preset read voltage set of the first target word-line;
        identifying a first predetermined threshold value, wherein the first predetermined threshold value is obtained according to an error checking and correction capability of the storage device; and
        determining whether a first voltage offset value between the first optimization read voltage set and the first preset read voltage set is greater than the first predetermined threshold value, comprising:
            if the first voltage offset value is greater than the first predetermined threshold value, determining that a checking result corresponding to the target physical unit is failure,
            if the first voltage offset value is not greater than the first predetermined threshold value, determining that the checking result corresponding to the target physical unit is success; and
    determining whether a first operation needs to be performed on valid data in the target physical unit according to the checking result corresponding to the target physical unit.

2. The memory management method of claim 1, wherein the step of determining whether the first operation needs to be performed on the valid data in the target physical unit according to the checking result corresponding to the target physical unit comprises:
    in response to the checking result determined to be success, determining that the first operation does not need to be performed on the valid data in the target physical unit, and recording a checking timestamp of the target physical unit that corresponds to the first checking operation;
    in response to the checking result determined to be failure, determining that the first operation needs to be performed on the valid data in the target physical unit, and performing the first operation.

3. The memory management method of claim 2, wherein the step of performing the first operation comprises:
    performing a wear leveling operation on the target physical unit;
    performing a garbage collection operation on the target physical unit; or
    performing a data merging operation on all the valid data in the target physical unit.

4. The memory management method of claim 1, wherein the specific event comprises:
    obtaining the first optimization read voltage set by completely performing a read voltage optimization operation corresponding to the first target word-line or the target physical unit, wherein the first checking operation is performed in response to the obtained first optimization read set;

a retention time value of one of the physical units being greater than a retention time threshold value, wherein the physical unit is set as the target physical unit, and the retention time value of the physical unit is calculated according to a current time of the storage device and a timestamp or a checking timestamp of the physical unit; and a counter value of the storage device having accumulated to a checking count value, wherein the counter value increases with operating time of the storage device, wherein, in response to the fact that the counter value has accumulated to the checking count value, the counter value is returned to zero and a physical unit having the greatest retention time value is selected as the target physical unit on which the first checking operation is performed.

5. The memory management method of claim 4, wherein timings at which the read voltage optimization operation is performed comprise:

when a number of error bits of data read from a physical unit has exceeded an error bit number threshold value, wherein the physical unit is set as the target physical unit;

when the storage device has been idle for longer than a predetermined idle time threshold; and when the storage device is powered on.

6. The memory management method of claim 1, wherein the first voltage offset value comprises:

a sum of a plurality of voltage offset values between a plurality of first optimization read voltages of the first optimization read voltage set and a plurality of first preset read voltages of the first preset read voltage set that respectively correspond to the first optimization read voltages.

7. The memory management method of claim 6, wherein the first checking operation further comprises:

identifying a second predetermined threshold value, wherein the second predetermined threshold value is obtained according to the error checking and correction capability of the storage device;

determining whether a second voltage offset value between a first optimization read voltage of the first optimization read voltage set and a first preset read voltage of the first preset read voltage set is greater than the second predetermined threshold value, comprising:

if the second voltage offset value is greater than the second predetermined threshold value, determining that the checking result corresponding to the target physical unit is failure.

8. The memory management method of claim 6, wherein the error checking and correction capability indicates a maximum number of error bits that the storage device is capable of correcting, and the memory management method further comprises:

calculating a test range according to the maximum number of error bits, wherein an upper limit of the test range is obtained by multiplying the maximum number of error bits by a first parameter, and a lower limit of the test range is obtained by multiplying the maximum number of error bits by a second parameter, wherein the first parameter and the second parameter are numerical values smaller than 1 and greater than zero, and the second parameter is smaller than the first parameter;

setting a plurality of different test read voltage sets, and reading test data from a test word-line using each of the test read voltage sets, so as to obtain a plurality of pieces of read test data;

identifying a plurality of numbers of test error bits of the pieces of read test data;

identifying a first number of test error bits within the test range among the numbers of test error bits, wherein the first number of test error bits is obtained according to first read test data read through a first test read voltage set among the test read voltage sets;

using a sum of a plurality of voltage offset values between a plurality of first test read voltages of the first test read voltage set and a plurality of second preset read voltages of a second preset read voltage set of the test word-line corresponding thereto as the first predetermined threshold value; and using an average value of the voltage offset values between the first test read voltages of the first test read voltage set and the second preset read voltages of the second preset read voltage set of the test word-line corresponding thereto as a second predetermined threshold value.

9. The memory management method of claim 1, wherein each of the word-lines comprises a plurality of memory cells, wherein each of the memory cells is configured to be programmed for storing a bit value corresponding to one of a plurality of different Gray codes, a total number of the Gray codes is N, and N is a predetermined positive integer greater than 2, wherein, if the step of identifying the first optimization read voltage set is absent, the memory management method further comprises:

performing a second checking operation on the target physical unit among the physical units according to the occurrence of the specific event, wherein the second checking operation comprises:

reading the first target word-line by using the first preset read voltage set so as to obtain a sum of Gray code count offset values;

identifying an offset threshold value, wherein the offset threshold value is obtained according to the error checking and correction capability of the storage device; and determining whether the sum of Gray code count offset values is greater than the offset threshold value, comprising:

if the sum of Gray code count offset values is greater than the offset threshold value, determining that the checking result corresponding to the target physical unit is failure, if the sum of Gray code count offset values is not greater than the offset threshold value, determining that the checking result corresponding to the target physical unit is success.

10. The memory management method of claim 1, wherein the step of determining whether the first operation needs to be performed on the valid data in the target physical unit according to the checking result corresponding to the target physical unit comprises:

in response to the checking result determined to be success, determining that the first operation does not need to be performed on the valid data in the target physical unit, and recording a checking timestamp of the target physical unit that corresponds to the first checking operation;

in response to the checking result determined to be failure, determining whether a number of pieces of valid data in the target physical unit is greater than a valid data threshold value, comprising:
if the number of pieces of valid data is greater than the valid data threshold value, determining that the first operation does not need to be performed on the valid data in the target physical unit, and replacing the first predetermined threshold value with a third predetermined threshold value for the next first checking operation to be performed on the target physical unit, wherein the third predetermined threshold value is greater than the first predetermined threshold value;
if the number of pieces of valid data is not greater than the valid data threshold value, determining that the first operation needs to be performed on the valid data in the target physical unit.

11. A storage controller configured to control a storage device having a rewritable non-volatile memory module, the storage controller comprising:
a connection interface circuit configured to be coupled to a host system;
a memory interface control circuit configured to be coupled to the rewritable non-volatile memory module, wherein the rewritable non-volatile memory module comprises a plurality of physical units, and each of the physical units has a plurality of word-lines;
a read voltage management circuit unit; and
a processor coupled to the connection interface circuit, the memory interface control circuit and the read voltage management circuit unit,
wherein the processor is configured to perform a first checking operation on a target physical unit among the physical units according to an occurrence of a specific event, wherein in the performed first checking operation,
according to the specific event, the processor identifies a first target word-line among a plurality of target word-lines of the target physical unit;
the processor identifies a first optimization read voltage set and a first preset read voltage set of the first target word-line through the read voltage management circuit unit;
the processor identifies a first predetermined threshold value, wherein the first predetermined threshold value is obtained according to an error checking and correction capability of the storage device; and
the processor determines whether a first voltage offset value between the first optimization read voltage set and the first preset read voltage set is greater than the first predetermined threshold value,
wherein, if the first voltage offset value is greater than the first predetermined threshold value, the processor determines that a checking result corresponding to the target physical unit is failure,
wherein, if the first voltage offset value is not greater than the first predetermined threshold value, the processor determines that the checking result corresponding to the target physical unit is success; and
the processor is further configured to determine whether a first operation needs to be performed on valid data in the target physical unit according to the checking result corresponding to the target physical unit.

12. The storage controller of claim 11, wherein in the operation of determining whether the first operation needs to be performed on the valid data in the target physical unit according to the checking result corresponding to the target physical unit,
in response to the checking result determined to be success, the processor determines that the first operation does not need to be performed on the valid data in the target physical unit, and records a checking timestamp of the target physical unit that corresponds to the first checking operation;
in response to the checking result determined to be failure, the processor determines that the first operation needs to be performed on the valid data in the target physical unit, and performs the first operation.

13. The storage controller of claim 12, wherein the operation of performing the first operation comprises:
the processor performs a wear leveling operation on the target physical unit;
the processor performs a garbage collection operation on the target physical unit; or
the processor performs a data merging operation on all the valid data in the target physical unit.

14. The storage controller of claim 11, wherein the specific event comprises:
through the read voltage management circuit unit, a read voltage optimization operation corresponding to the first target word-line or the target physical unit is completely performed and the first optimization read voltage set is obtained, wherein the processor performs the first checking operation in response to the obtained first optimization read voltage set;
the processor identifies that a retention time value of one of the physical units is greater than a retention time threshold value, wherein the physical unit is set as the target physical unit by the processor, and the retention time value of the physical unit is calculated according to a current time of the storage device and a timestamp or a checking timestamp of the physical unit; and
when a counter value of the storage device has accumulated to a checking count value, wherein the processor causes the counter value to increase with operating time of the storage device, in response to the fact that the counter value has accumulated to the checking count value, the processor returns the counter value to zero and selects a physical unit having the greatest retention time value as the target physical unit to perform the first checking operation thereon.

15. The storage controller of claim 13, wherein timings at which the read voltage optimization operation is performed comprise:
when a number of error bits of data read from a physical unit has exceeded an error bit number threshold value, wherein the physical unit is set as the target physical unit;
when the storage device has been idle for longer than a predetermined idle time threshold; and
when the storage device is powered on.

16. The storage controller of claim 11, wherein the first voltage offset value comprises:
a sum of a plurality of voltage offset values between a plurality of first optimization read voltages of the first optimization read voltage set and a plurality of first preset read voltages of the first preset read voltage set that respectively correspond to the first optimization read voltages.

17. The storage controller of claim 16, wherein the first checking operation further comprises:
the processor identifies a second predetermined threshold value, wherein the second predetermined threshold value is obtained according to the error checking and correction capability of the storage device;

the processor determines whether a second voltage offset value between a first optimization read voltage of the first optimization read voltage set and a first preset read voltage of the first preset read voltage set is greater than the second predetermined threshold value, wherein, if the second voltage offset value is greater than the second predetermined threshold value, the processor determines that the checking result corresponding to the target physical unit is failure.

18. The storage controller of claim 16, wherein the error checking and correction capability indicates a maximum number of error bits that the storage device is capable of correcting, wherein a test range is calculated according to the maximum number of error bits, wherein an upper limit of the test range is obtained by multiplying the maximum number of error bits by a first parameter, and a lower limit of the test range is obtained by multiplying the maximum number of error bits by a second parameter, wherein the first parameter and the second parameter are numerical values smaller than 1 and greater than zero, and the second parameter is smaller than the first parameter;

the processor sets a plurality of different test read voltage sets, and reads test data from a test word-line using each of the test read voltage sets, so as to obtain a plurality of pieces of read test data;

the processor identifies a plurality of numbers of test error bits of the pieces of read test data;

the processor identifies a first number of test error bits within the test range among the numbers of test error bits, wherein the first number of test error bits is obtained according to first read test data read through a first test read voltage set among the test read voltage sets;

the processor uses a sum of a plurality of voltage offset values between a plurality of first test read voltages of the first test read voltage set and a plurality of second preset read voltages of a second preset read voltage set of the test word-line corresponding thereto as the first predetermined threshold value; and the processor uses an average value of the voltage offset values between the first test read voltages of the first test read voltage set and the second preset read voltages of the second preset read voltage set of the test word-line corresponding thereto as a second predetermined threshold value.

19. The storage controller of claim 11, wherein each of the word-lines comprises a plurality of memory cells, wherein each of the memory cells is configured to be programmed for storing a bit value corresponding to one of a plurality of different Gray codes, a total number of the Gray codes is N, and N is a predetermined positive integer greater than 2, wherein, if the processor does not identify the first optimization read voltage set, the processor performs a second checking operation on the target physical unit among the physical units according to the occurrence of the specific event, wherein in the operation of performing the second checking operation on the target physical unit among the physical units, the processor instructs the read voltage management circuit unit to read the first target word-line by using the first preset read voltage set so as to obtain a sum of Gray code count offset values;

the processor identifies an offset threshold value, wherein the offset threshold value is obtained according to the error checking and correction capability of the storage device;

the processor determines whether the sum of Gray code count offset values is greater than the offset threshold value, wherein, if the sum of Gray code count offset values is greater than the offset threshold value, the processor determines that the checking result corresponding to the target physical unit is failure, wherein, if the sum of Gray code count offset values is not greater than the offset threshold value, the processor determines that the checking result corresponding to the target physical unit is success.

20. The storage controller of claim 11, wherein in the operation of determining whether the first operation needs to be performed on the valid data in the target physical unit according to the checking result corresponding to the target physical unit, in response to the checking result determined to be success, the processor determines that the first operation does not need to be performed on the valid data in the target physical unit, and records a checking timestamp of the target physical unit that corresponds to the first checking operation;

in response to the checking result determined to be failure, the processor determines whether a number of pieces of valid data in the target physical unit is greater than a valid data threshold value;

wherein, if the number of pieces of valid data is greater than the valid data threshold value, the processor determines that the first operation does not need to be performed on the valid data in the target physical unit, and replaces the first predetermined threshold value with a third predetermined threshold value for the next first checking operation to be performed on the target physical unit, wherein the third predetermined threshold value is greater than the first predetermined threshold value; and if the number of pieces of valid data is not greater than the valid data threshold value, the processor determines that the first operation needs to be performed on the valid data in the target physical unit.

* * * * *